United States Patent [19]

Henry et al.

[11] 4,291,942
[45] Sep. 29, 1981

[54] OPTO-ELECTRONIC COUPLING HEAD

[75] Inventors: Raymond Henry; Jacques Simon, both of Paris, France

[73] Assignee: Thomson-CSF, Paris, France

[21] Appl. No.: 118,853

[22] Filed: Feb. 5, 1980

[30] Foreign Application Priority Data

Feb. 8, 1979 [FR] France ................. 79 03226

[51] Int. Cl.³ .............................. G02B 5/14
[52] U.S. Cl. ................................. 350/96.20
[58] Field of Search ............. 350/96.20, 96.17; 250/552, 227; 357/17

[56] References Cited

U.S. PATENT DOCUMENTS

| | | | |
|---|---|---|---|
| 3,423,594 | 1/1969 | Galopin | 350/96.20 |
| 3,859,536 | 1/1975 | Thiel | 250/552 |
| 3,954,338 | 5/1976 | Hennel et al. | 356/138 |
| 4,118,100 | 10/1978 | Goell et al. | 350/96.20 |
| 4,173,389 | 11/1979 | Curtis | 350/96.20 |
| 4,192,574 | 3/1980 | Henry et al. | 350/96.20 |

FOREIGN PATENT DOCUMENTS 2724850 12/1978 Fed. Rep. of Germany ... 350/96.15
2313668 6/1975 France .

*Primary Examiner*—Stewart J. Levy
*Attorney, Agent, or Firm*—Oblon, Fisher, Spivak, McClelland & Maier

[57] ABSTRACT

An opto-electronic coupling head ensuring the accurate positioning, in an hermetic device, of the endmost face of an optical fiber and of the active face of an opto-electronic component. With the fiber secured in the axial bore of a fiber-holder, a system of wedges provides a bearing plane for the support of an opto-electronic component. A plate serves as a base for a cover provided with sealed through-leads for the electrical connection of the component, and mechanically independent of the component and of the fiber.

4 Claims, 3 Drawing Figures

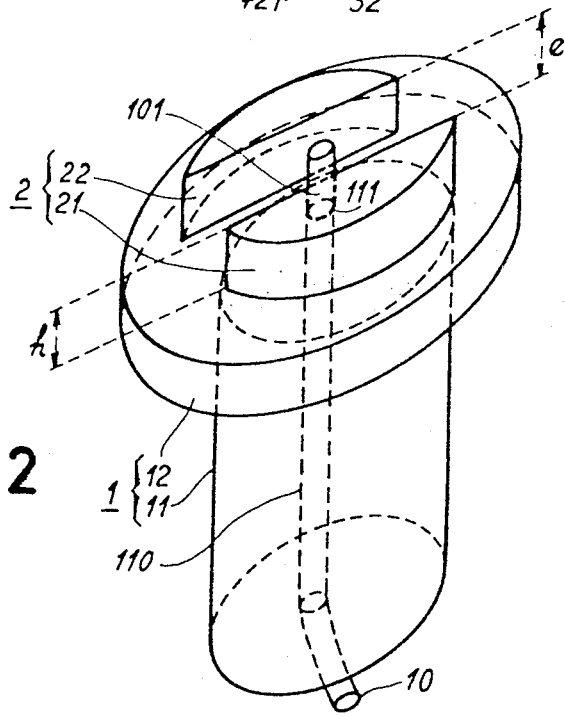
FIG.1
FIG.2
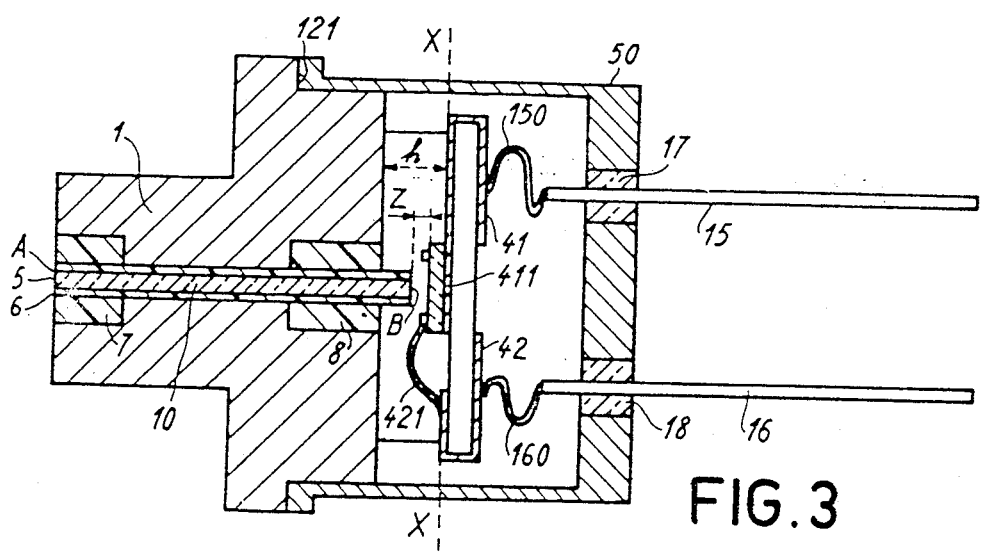
FIG.3

OPTO-ELECTRONIC COUPLING HEAD

BACKGROUND OF THE INVENTION

1. Field of the Invention

The invention relates to an opto-electronic coupling head which may be either a transmitting head, a receiving (or detection) head or possibly a mixed head (transmission or reception).

2. Description of the Prior Art

It is known that an optical fiber telecommunication link may comprise:

a transmitting head comprising an optical transmitter modulated by the information to be transmitted, this transmitter being for example a light-emitting diode or a laser diode, coupled with an optical fiber section;

at least one connector coupling the optical fiber section with one or more optical fibers;

at least one optical cable comprising a variable number of fibers one or more of which are assigned to the transmission of the information from the transmitter;

at least one connector coupling the optical fiber(s) concerned by the transmission in question with an optical fiber section;

a reception (or detection) head comprising an optical fiber section coupled with an optical (photodiode) receiver (or detector) restoring the information in electrical form.

A mixed head would comprise a component capable of operating as transmitter or receiver depending on the direction of polarization of the component.

A complete link comprises a link of the above type in each transmission direction.

The construction of a transmitting or receiving head poses problems:

of a mechanical kind, for it is necessary to position and secure, in the optical position, the opto-electronic component (transmitter or receiver) in relation to the endmost (input or output) surface of the optical fiber section;

of an electrical and optical kind, insofar particularly as the tightness of the components is concerned so as to ensure and maintain a good electrical insulation of the components of the head, and the optical qualities of the optical or opto-electronic members.

Known solutions are either complex constructions with a high manufacturing cost or much simpler constructions but not giving the accuracy of positioning with a construction of great simplicity and a moderate cost price.

This solution presents the advantage of enabling two operations required in the manufacture of the head to be separated into two independent phases, namely the adjustment of the position of the optro-electronic component in relation to the optical fiber and the finishing of the tightness of the head.

SUMMARY OF THE INVENTION

The opto-electronic coupling head of the invention is of the type comprising a support device for the optro-electronic component, the opto-electronic component itself, an optical fiber positioning device called a fiber-holder which accommodates an optical fiber section, and an encasing device comprising a base and a cover.

In the case of the invention the end of the fiber-holder, situated on the same side as the electronic component, comprises a system of wedges integral with the fiber-holder defining by their coplanar faces a bearing plane for the support device of the opto-electronic component. The base is formed by the fiber-holder itself and the support device is fixed to these coplanar faces.

The above and other objects, features and advantages of the present invention will become apparent from the following description, given solely by way of non-limiting illustration, when taken in conjunction with the accompanying drawings.

DESCRIPTION OF THE DRAWINGS

FIG. 1 shows a support device for the electronic component provided with a component equipped with electrical connections.

FIG. 2 shows a fiber-holder fitted with wedges according to the invention.

FIG. 3 shows in schematical section one embodiment of the invention.

DESCRIPTION OF THE PREFERRED EMBODIMENT

A fiber-holder 1 is shown in perspective in FIG. 2. It is very much simplified in relation to the embodiment given by way of example in FIG. 3. It comprises a cylindrical mandrel 11 having along its axis a cylindrical bore 110 containing an optical fiber 10. The mandrel abuts against a cylindrical plate 12 having the same axis, comprising an axial aperture 111 of the same diameter as housing 110. From this orifice emerges the end 101 of fiber 10. A system 2 of symmetrical wedges 21 and 22 is welded to plate 12 on each side of the fiber. The spacing e between these wedges is between two limits which are respectively the diameter of support 3 (FIG. 1) of the opto-electronic component 4 and the largest dimension of this component. This spacing is necessary to leave a sufficient space for the fiber, the opto-electronic component and the electrical connections thereof. For the sake of clarity in the drawing, connections 41 and 42 of the component are shown as simple conducting strips bent downward at the moment when they reach the edge of support 3, then folded back parallel to a large face of support 3, then in reality (see FIG. 3) they are applied against the free face of the support. One of the connections, 41 for example, is a metalization edged on face 411 of the support and on which is soldered the lower metalized face of component 4. Connection 42 comprises a flexible wire 421 extending from the electrode of a component. Support 3 is for example made from ceramics. The thickness h of the wedges is greater than that of component 4, for example of the order of three to four times this latter. The insulating support 3 comprises two metalized areas 31 and 32, facilitating the welding of the support on the wedges. These latter are either metallic and welded to the fiber-holder 1, itself metallic, or insulating and forming for example an integral part of a molded plastic material body and comprising parts 1 and 2. In this latter case, the faces of the wedges defining the bearing plane of the support are metalized also to facilitate the welding with the metalized areas of support 3.

There is shown in FIG. 3 an opto-electronic head mounted and encased. In the embodiment shown, the mandrel and the plate form a single piece 1, for example made from copper. The plane of the figure is an axial section plane parallel to the opposing faces of wedges 21 and 22. A single one of these faces can be seen in FIG. 2. The optical fiber 10, whose section shows the core 5 and the sheath 6, is formed by an optical fiber section terminated by two flat faces A and B. Face A is coplanar with the endmost face of the mandrel of the fiber-holder. Face B is at a distance z from the active face of component 4. The section is fixed in the axial bore of the fiber-holder by means of solder or resin deposits 7 and 8 effected in larger diameter portions of the bore situated at the ends of this bore. No mechanical play is tolerated between fiber and fiber-holder. The purpose of the complete adjustment of the head is to fix the respective positions of component 4 and fiber 10 so as to obtain the best opto-electronic yield. It comprises the following operations:

(1) Before securing the optical fiber in the fiber-holder by soldering or bonding, the position of face B is determined in relation to the bearing plane of support 3 on wedges 21 and 22 (plane along XX in FIG. 3). This determination is effected by means of a gauge whose size takes into account the thickness of component 4 between its active face and plane XX. The choice of the gauge is effected by trial and error on a head prototype, then applied systematically for mass production. Distance z is adjusted so as to render optimal the transmission or the reception of light by the opto-electronic component.

(2) The fiber is fixed by means of deposits 7 and 8, then the fiber section is cut at the end of the mandrel and face A is polished.

(3) Support 3 provided with component 4 is applied on wedges 21 and 22 and the position of the support in plane XX (so-called "x, y" adjustment) is adjusted by feeding the component by means of temporary connections and by checking the proper operation of the head. The position of the support in plane XX which gives the optimum result is noted.

(4) Support 3 is welded to wedges 21 and 22.

In FIG. 3, the complete head comprises furthermore a metal cover 50, fitted with two through-leads 15 and 16 by means of glass beads 17 and 18. These through-leads 15 and 16 are rigid rods which are good conductors of electricity. They are terminated by contact springs 150 and 160 pressing on the metalized areas 41 and 42 of support 3.

Cover 50 is welded to the fiber-holder along a circular recess 121 thereof.

In another embodiment, the connections to metalizations 41 and 42 are disposed laterally and traverse the cover by means of glass beads placed on the periphery of this latter.

Among the advantages of the invention not already pointed out, it may be mentioned that it can be easily used in the case:

of very large or very small-diameter optical fiber, by constructing a fiber-holder of suitable dimensions;

of very cumbersome opto-electronic components, by adapting the fiber-holder, the support and the cover to the dimensions of the component; this latter may be possible a laser diode;

finally, of optical fiber sections connected to very different connectors.

It is apparent that within the scope of the invention, modifications and different arrangements can be made other than is here disclosed. The present disclosure is merely illustrative with the invention comprehending all variations thereof.

What we claim is:

1. An opto-electronic coupling head comprising:
   an opto-electronic component including electrical connections;
   a support device for said opto-electronic component;
   an optical fiber-holder which accommodates an optical fiber section;
   an encasing device comprising a base formed by said fiber-holder and a cover, wherein the end of said fiber-holder situated on the same side as said component includes a system of wedges integral with said fiber-holder, said wedges defining by their coplanar faces a bearing plane for said support device of said component with said support device being fixed to said bearing plane in such a manner that the optimum optical converting efficiency of said opto-electronic component is attained, and wherein said cover has electrical through-leads; and
   contact springs attached to said through-leads and bearing against said electrical connectors at a point along the extent of each of said connectors determined by the fixed location of said component on said wedged determined bearing plane, thus permitting the adjustment of the position of said opto-electronic component with respect to the optical fiber separately from the finishing of the tightness of said head.

2. The coupling head as claimed in claim 1, wherein the opto-electronic component comprises, on the face opposite its active face, a metalization welded to a metalization previously formed on the support device, this latter being insulating and comprising, besides said metalization, metalized areas for welding the support to the bearing faces of the wedges.

3. The coupling head as claimed in claim 2, wherein the fiber-holder comprises a cylindrical mandrel having along its axis a cylindrical bore for receiving the fiber section, a cylindrical plate having a through-bore similar to that of the mandrel being coaxially abutted against this latter, the periphery of the plate having a profile adapted to that of said cover so as to facilitate the welding of this latter on the base formed by the fiber-holder.

4. The coupling head as claimed in claim 3, wherein electrical connections for connecting the opto-electronic component pass through the cover, the through-leads being provided with devices for sealing them, said cover being mechanically independent of the component on the one hand and of the fiber section on the other.

* * * * *